(12) United States Patent
Juengling

(10) Patent No.: US 10,833,059 B2
(45) Date of Patent: Nov. 10, 2020

(54) INTEGRATED ASSEMBLIES COMPRISING VERTICALLY-STACKED DECKS OF MEMORY ARRAYS

(71) Applicant: Micron Technology, Inc., Boise, ID (US)

(72) Inventor: Werner Juengling, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/213,257

(22) Filed: Dec. 7, 2018

(65) Prior Publication Data

US 2020/0185370 A1    Jun. 11, 2020

(51) Int. Cl.

| H01L 25/18 | (2006.01) |
|---|---|
| H01L 23/528 | (2006.01) |
| H01L 27/108 | (2006.01) |
| H01L 23/522 | (2006.01) |
| G11C 11/4091 | (2006.01) |
| G11C 11/408 | (2006.01) |
| H01L 23/544 | (2006.01) |
| H01L 25/065 | (2006.01) |

(52) U.S. Cl.
CPC .......... *H01L 25/18* (2013.01); *G11C 11/4085* (2013.01); *G11C 11/4091* (2013.01); *H01L 23/528* (2013.01); *H01L 23/5226* (2013.01); *H01L 23/544* (2013.01); *H01L 25/0657* (2013.01); *H01L 27/10805* (2013.01); *H01L 27/10897* (2013.01); *H01L 2223/54426* (2013.01); *H01L 2223/54493* (2013.01); *H01L 2225/06541* (2013.01); *H01L 2225/06565* (2013.01)

(58) Field of Classification Search
None
See application file for complete search history.

(56) References Cited

U.S. PATENT DOCUMENTS

| 5,953,242 A | * | 9/1999 | Kitsukawa | ............. | G11C 5/025 |
| | | | | | 365/51 |
| 6,026,225 A | * | 2/2000 | Iwasaki | ............... | G06F 17/5068 |
| | | | | | 716/112 |
| 6,504,742 B1 | * | 1/2003 | Tran | ........................ | G11C 5/02 |
| | | | | | 257/E21.614 |

(Continued)

OTHER PUBLICATIONS

U.S. Appl. No. 16/212,418, filed Dec. 6, 2018 by Werner Juengling.

*Primary Examiner* — J. H. Hur
(74) *Attorney, Agent, or Firm* — Wells St. John P.S.

(57) ABSTRACT

Some embodiments include an integrated assembly having a base supporting first circuitry and first conductive lines. The first conductive lines extend along a first direction and are associated with the first circuitry. A deck is over the base and supports an array of memory cells and second conductive lines which are associated with the array of memory cells. The second conductive lines extend along a second direction which is substantially orthogonal to the first direction. Vertical interconnects extend from the deck to the base and couple the first conductive lines to the second conductive lines. Each of the vertical interconnects couples one of the first conductive lines to one of the second conductive lines. Each of the second conductive lines is coupled with only one of the first conductive lines.

10 Claims, 10 Drawing Sheets

(56) References Cited

U.S. PATENT DOCUMENTS

| | | | | |
|---|---|---|---|---|
| 6,717,833 B2* | 4/2004 | Kitsukawa | ............... | G11C 7/10 |
| | | | | 365/196 |
| 6,879,506 B2* | 4/2005 | Lebourg | ................. | G11C 17/10 |
| | | | | 257/E27.071 |
| 7,982,504 B1* | 7/2011 | Robinett | ......... | H01L 21/823871 |
| | | | | 326/101 |
| 2003/0067043 A1* | 4/2003 | Zhang | ...................... | G11C 7/18 |
| | | | | 257/390 |
| 2005/0286286 A1* | 12/2005 | Saito | ........................ | G11C 5/02 |
| | | | | 365/63 |
| 2009/0122598 A1* | 5/2009 | Toda | ...................... | G11C 5/063 |
| | | | | 365/158 |
| 2013/0292633 A1* | 11/2013 | Pellizzer | ............. | H01L 27/2463 |
| | | | | 257/5 |
| 2014/0104938 A1* | 4/2014 | Castro | ................. | H01L 27/2436 |
| | | | | 365/163 |

* cited by examiner

US 10,833,059 B2

INTEGRATED ASSEMBLIES COMPRISING VERTICALLY-STACKED DECKS OF MEMORY ARRAYS

TECHNICAL FIELD

Integrated assemblies comprising vertically-stacked decks.

BACKGROUND

Memory is utilized in modern computing architectures for storing data. One type of memory is Dynamic Random-Access Memory (DRAM). DRAM may provide advantages of structural simplicity, low cost and high speed in comparison to alternative types of memory.

DRAM may utilize memory cells which have one capacitor in combination with one transistor (so-called 1T-1C memory cells), with the capacitor being coupled with a source/drain region of the transistor. An example 1T-1C memory cell 2 is shown in FIG. 1, with the transistor labeled T and the capacitor labeled C. The capacitor has one node coupled with a source/drain region of the transistor, and has another node coupled with a common plate, CP. The common plate may be coupled with any suitable voltage, such as a voltage within a range of from greater than or equal to ground to less than or equal to VCC (i.e., ground-≤CP≤VCC). In some applications, the common plate is at a voltage of about one-half VCC (i.e., about VCC/2). The transistor has a gate coupled to a wordline WL (i.e., access line), and has a source/drain region coupled to a bitline BL (i.e., digit-line or sense line). In operation, an electrical field generated by voltage along the wordline may gatedly couple the bitline to the capacitor during read/write operations.

Another prior art 1T-1C memory cell configuration is shown in FIG. 2. The configuration of FIG. 2 shows two memory cells 2a and 2b; with memory cell 2a comprising a transistor T1 and a capacitor C1, and with the memory cell 2b comprising a transistor T2 and a capacitor C2. Wordlines WL0 and WL1 are electrically coupled with the gates of transistors T1 and T2, respectively. A connection to a bitline BL is shared by the memory cells 2a and 2b.

The memory cells described above may be incorporated into memory arrays, and in some applications the memory arrays may have open bitline arrangements. An example integrated assembly 9 having open bitline architecture is shown in FIG. 3. The assembly 9 includes two laterally adjacent memory arrays ("Array 1" and "Array 2"), with each of the arrays including memory cells of the type described in FIG. 2 (not labeled in FIG. 3 in order to simplify the drawing). Wordlines WL0-WL7 extend across the arrays, and are coupled with wordline drivers. Digit-lines D0-D8 are associated with the first array (Array 1), and digit-lines D0*-D8* are associated with the second array (Array 2). Sense amplifiers SA0-SA8 are provided between the first and second arrays. Digit-lines at the same height are paired within one another and compared through a sense amplifier (e.g., digit-lines D0 and D0* are paired with one another and compared with the sense amplifier SA0). In a read operation, one of the paired digit-lines may serve as a reference in determining electrical properties (e.g., voltage) of the other of the paired digit-lines.

A continuing goal of integrated circuit fabrication is to increase integration. There is interest in stacking decks (tiers) of integrated circuitry to achieve high integration. However, it is proving difficult to couple circuitry from the upper decks with the circuitry of the lower decks, particularly since there is generally at least some risk of misalignment of the decks. It would be desirable to develop three-dimensional arrangements enabling coupling of the circuitry from the upper decks to that of the lower decks, and enabling the ability to correct for possible misalignment.

DETAILED DESCRIPTION OF THE ILLUSTRATED EMBODIMENTS

Some embodiments include integrated assemblies which have conductive extensions from wordlines and/or digit-lines of one or more memory decks, with such conductive extensions crossing conductive lines of another deck. The crossing of the extensions from a memory deck with the conductive lines of another deck may enable interconnects to be formed from the circuitry of the memory deck to the circuitry of the other deck, even if there is misalignment between the memory deck and the other deck. In some embodiments, the other deck may be a base deck under the memory deck, and may comprise wordline-driver-circuitry and/or sense-amplifier-circuitry. Example embodiments are described with reference to FIGS. 4-11.

Figure 4:
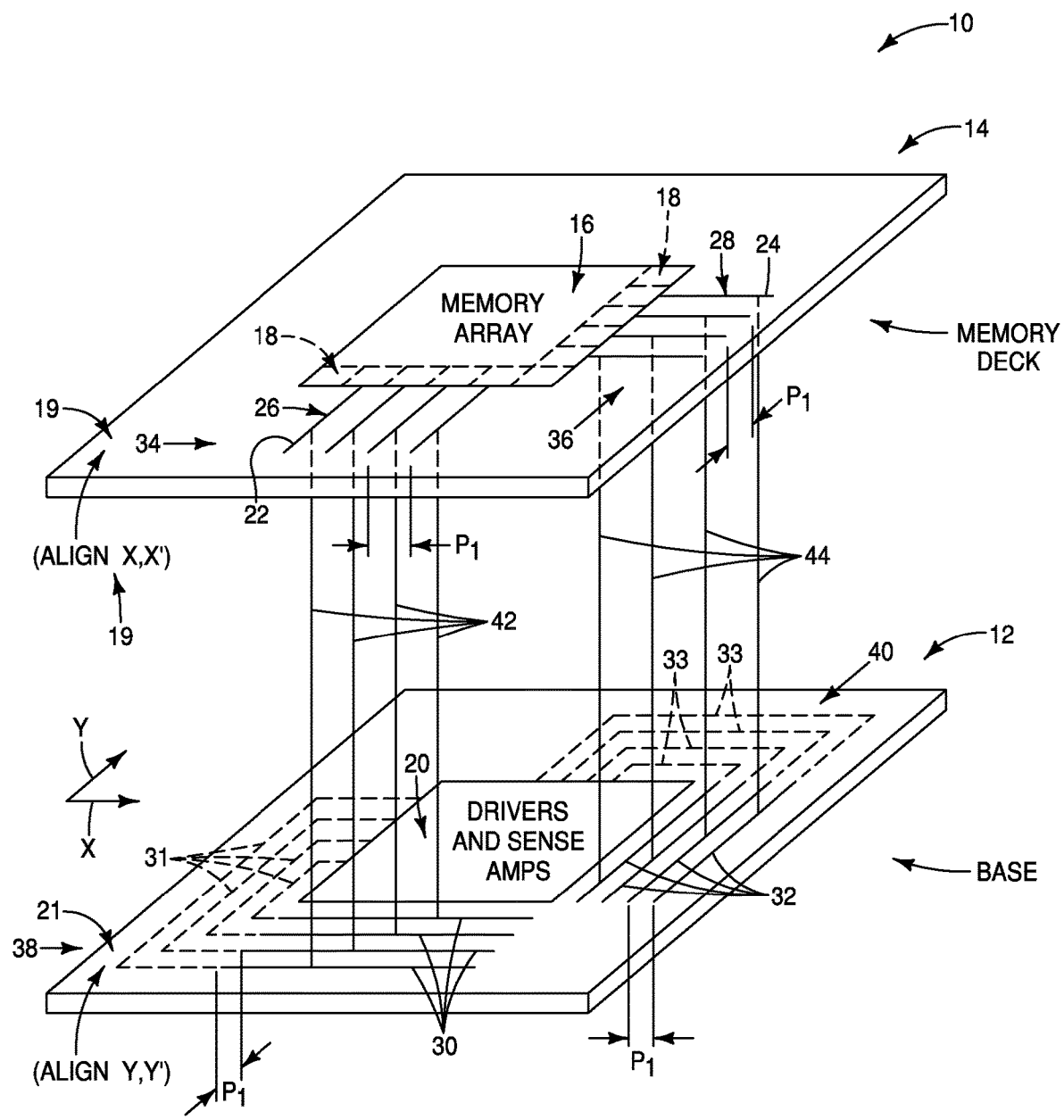
FIGS. 4-8 are schematic diagrams of example integrated assemblies having multiple decks which are vertically displaced relative to one another.

Referring to FIG. 4, an integrated assembly 10 includes a base 12 and a deck 14 over the base. The base 12 and the deck 14 may be considered to be examples of levels that are stacked one atop the other. The levels may be within different semiconductor dies, or may be within the same semiconductor die.

Figure 1:
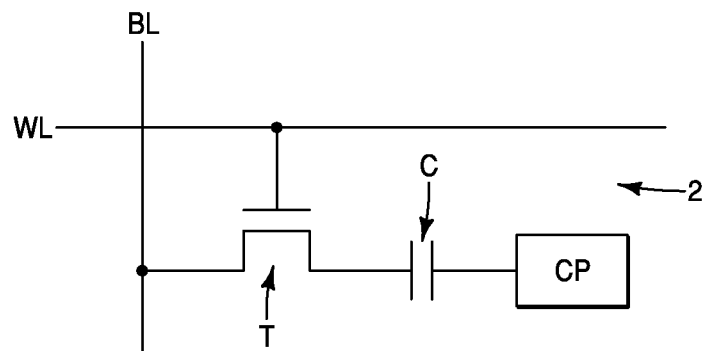
FIG. 1 is a schematic diagram of a prior art memory cell having 1 transistor and 1 capacitor.
Figure 2:
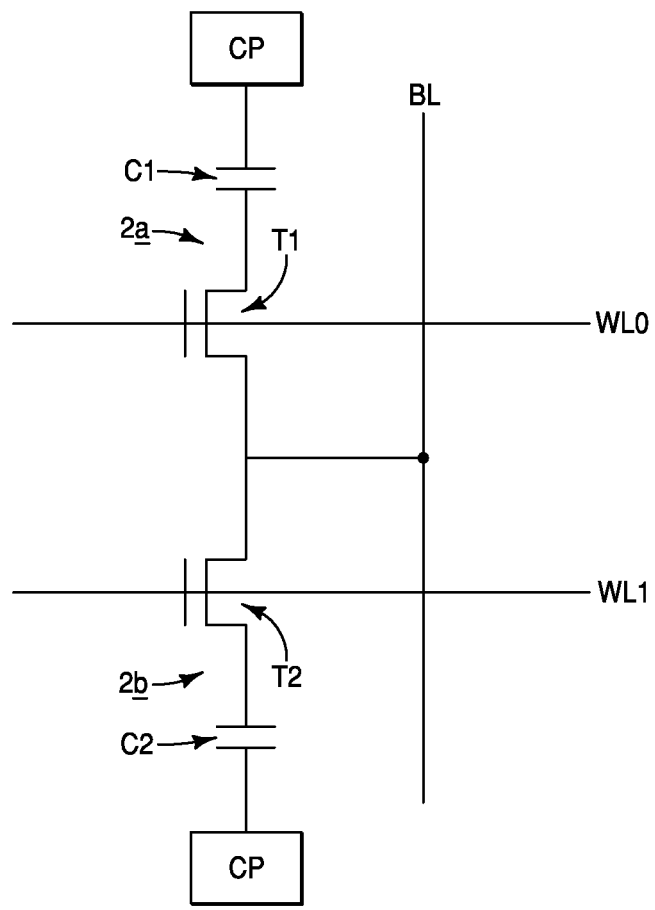
FIG. 2 is a schematic diagram of a pair of prior art memory cells which each have 1 transistor and 1 capacitor, and which share a bitline connection.
Figure 3:
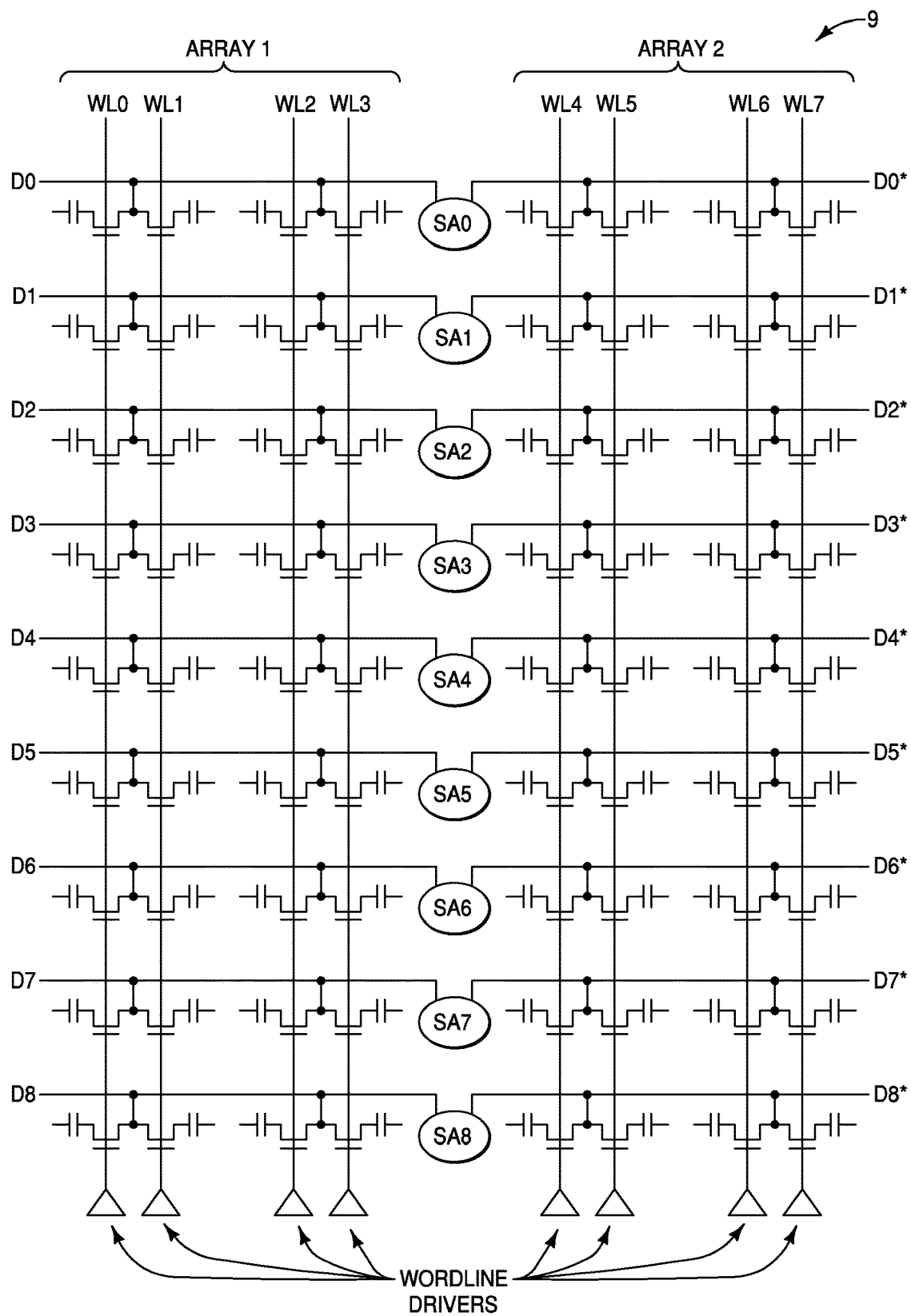
FIG. 3 is a schematic diagram of a prior art integrated assembly having open bitline architecture.

The deck 14 includes a memory array 16. The memory array includes memory cells 18 which are diagrammatically illustrated as boxes within the memory array. Only some of the memory cells are shown, but in practice the memory cells may extend entirely across the memory array. The memory array 16 may comprise any suitable number of the memory cells 18, and in some embodiments may comprise hundreds, thousands, millions, etc., of the memory cells. The memory cells may be DRAM cells, and in some embodiments may be configured in arrangements of the types described above with reference to prior art FIGS. 1-3. In some embodiments, the array 16 may be referred to as an array of memory cells. In some embodiments, the deck 14 may be referred to as a memory deck.

The base 12 may comprise semiconductor material; and may, for example, comprise, consist essentially of, or consist of monocrystalline silicon. The base 12 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 12 may correspond to a semiconductor substrate containing one or more materials associated with integrated circuit fabrication. Such materials may include, for example, one or more of refractory metal materials, barrier materials, diffusion materials, insulator materials, etc. It is noted that the deck 14 may also comprise semiconductor material, and may also be referred to as a semiconductor substrate.

The structure 12 is referred to as a "base" because it is below the memory deck 14. The structure 12 may be alternatively referred to as a deck. The structure 12 may be a bottommost deck of an assembly (as shown), or there may be additional decks beneath the illustrated structure 12. Also, there may be additional decks over the memory deck 14.

In the shown embodiment, the base 12 comprises circuitry 20 which includes driver circuitry (e.g., wordline-driver-circuitry) and sense-amplifier-circuitry. The circuitry 20 may be referred to as "first circuitry" to distinguish it from other circuitry, such as, for example, the memory-array-circuitry along deck 14.

Embodiments described herein pertain to architectures which enable wiring associated with an upper deck (e.g., deck 14) to be coupled to wiring associated with a lower deck (e.g., base 12), even if the upper and lower decks are misaligned relative to one another. In the shown embodiment, the memory deck 14 has digit-lines 22 (only some of which are shown) and wordlines 24 (only some of which are shown); with the digit-lines and wordlines being associated with the memory array 16. For instance, the digit-lines and wordlines may have relationships to the memory array analogous to those described above with reference to FIG. 3. The digit-lines 22 and wordlines 24 pass through the memory array 16, but the actual passage of such lines through the memory array is not shown in FIG. 4 in order to simplify the drawing. In some embodiments, the portions of the digit lines 22 outside of the memory array 16 may be considered to be digit-line-extensions 26; with such digit line extensions being coupled with the regions of the digit-lines passing through the memory array. Similarly, the portions of the wordlines 24 outside of the memory array may be considered to be wordline-extensions 28 which are coupled with the regions of the wordlines passing through the memory array.

An x/y axis is provided adjacent the assembly 10. The wordline-extensions 28 extend outwardly from the memory array along a first direction corresponding to the x-axis direction, and the digit-line-extensions 26 extend outwardly from the memory array along a second direction corresponding to the y-axis direction.

The base 12 supports a first series of conductive lines 30 and a second series of conductive lines 32. The conductive lines 30 extend along the first direction (i.e., the y-axis direction) and are configured for being coupled with the digit-line-extensions 26; and the conductive lines 32 extend along the second direction (i.e., the y-axis direction) and are configured for being coupled with the wordline-extensions 28. Notably, the conductive lines 30 cross the digit-line-extensions 26 (and in the shown embodiment are orthogonal to the digit-line-extensions 26), and accordingly connection can be made between the digit-line-extensions 26 and the conductive lines 30 even if the memory deck 14 is misaligned relative to the base 12. Similarly, the conductive lines 32 cross the wordline-extensions 28 (and in the shown embodiment are orthogonal to the wordline-extensions 28), and accordingly connection can be made between the wordline-extensions 28 and the conductive lines 32 even if the memory deck 14 is misaligned relative to the base 12.

The conductive lines 30 are coupled with the sense amplifiers within the circuitry 20, as is diagrammatically illustrated with dashed lines 31 extending from the conductive lines 32 the circuitry 20. In some embodiments, the conductive lines 30 may be referred to as first conductive lines which are associated with the base 12, and which extend to the sense-amplifier-circuitry of circuitry 20.

The conductive lines 32 are coupled with the wordline drivers within the circuitry 20, as is diagrammatically illustrated with the dashed lines 33 extending from the conductive lines 32 to the circuitry 20. In some embodiments, the conductive lines 32 may be referred to as second conductive lines which are associated with the base 12, and which extend to the wordline-driver-circuitry of circuitry 20.

The circuitry 20 of base 12 may be provided in any desired region of the base; and similarly the memory array 16 of deck 14 may be provided in any suitable region of the deck. In the illustrated embodiment, the circuitry 20 is provided directly beneath the memory array 16.

The digit-line-extensions 26 may be considered to be within a first connection-bank-region 34 associated with the deck 14, and the wordlines 28 may be considered to be within a second connection-bank-region 36 associated with the deck 14. The conductive lines 30 may be considered to be within a third connection-bank-region 38 associated with the base 12, and the conductive lines 32 to be considered to be within a fourth connection-bank-region 40 associated with the base 12. In the shown embodiment, the first connection-bank-region 34 is directly above the third connection-bank-region 38 so that the digit-line-extensions 26 may be coupled to the conductive lines 30, and the second connection-bank-region 36 is directly above the fourth connection-bank-region 40 so that the wordline-extensions 28 may be coupled with the conductive lines 32.

In some embodiments, the conductive lines 30 within the connection-bank-region 38 may be referred to as first conductive lines, and the conductive lines 26 within the connection-bank-region 34 may be referred to as second conductive lines. The first conductive lines extend along a first direction (i.e., the x-axis direction), and the second conductive lines extend along a second direction (i.e., the y-axis direction) which is substantially orthogonal to the first direction (with the term "substantially orthogonal" meaning orthogonal to within reasonable tolerances of fabrication and measurement). Similarly, in some embodiments the conductive lines 32 within the connection-bank-region 40 may be referred to as first conductive lines, and the conductive lines 28 within the connection-bank-region 36 may be referred to as second conductive lines; with the second conductive lines extending substantially orthogonally relative to the first conductive lines.

The digit-line-extensions 26 are shown to be coupled with the conductive lines 30 through vertical interconnects 42; and the wordline-extensions 28 are shown to be coupled with the conductive lines 32 through vertical interconnects 44. In the illustrated embodiment, each of the vertical interconnects 42 couples one of the digit-line-extensions 26 to one of the conductive lines 30, and each of the digit-line-extensions is coupled with only one of the conductive lines 30. Accordingly, each conductive line 30 is uniquely coupled with one of the digit-lines 22. Similarly, each of the vertical interconnects 44 couples one of the wordline-extensions 28 with only one of the conductive lines 32, and each of the wordline-extensions is coupled with only one of the conductive lines 32. Accordingly, each conductive line 32 is uniquely coupled with only one of the wordlines 24.

In some embodiments, the digit-line-extensions 26 may be on a same pitch as the digit-lines 22, and in the shown embodiment are on a pitch $P_1$. The conductive lines 30 may be on the same pitch as the digit-line-extensions 26, and in the shown embodiment are shown to be on the pitch $P_1$. The wordline-extensions 28 may be on a same pitch as the wordlines, and the wordlines may be on a same pitch as the digit-lines 22. In the shown embodiment, the wordline-extensions 28 are shown to be on the pitch $P_1$. The conductive lines 32 may be on the same pitch as the wordline-extensions 28, and are shown to be on the pitch $P_1$. The pitch $P_1$ may be the so-called "array pitch", and specifically may be the pitch of the wordlines and/or digit-lines within the memory array.

FIG. 4 diagrammatically illustrates alignment marks 19 and 21 at corners of the decks 12 and 14, respectively. The alignment mark 19 has a first pattern to establish alignment of the digit-line-extensions 26 along a first axis (with such first pattern being designated as X), and has a second pattern to establish alignment of the wordline-extensions 28 along the first axis (with such second pattern being designated as X'). The alignment mark 21 has a third pattern to establish alignment of the conductive lines 30 along a second axis orthogonal to the first axis (with such second pattern being designated as Y), and has a fourth pattern to establish alignment of the conductive lines 32 along the second axis (with such third pattern being designated as Y'). Some embodiments (discussed below with reference to, for example, FIG. 7) may simplify the alignment of the vertically-stacked decks.

Figure 5:
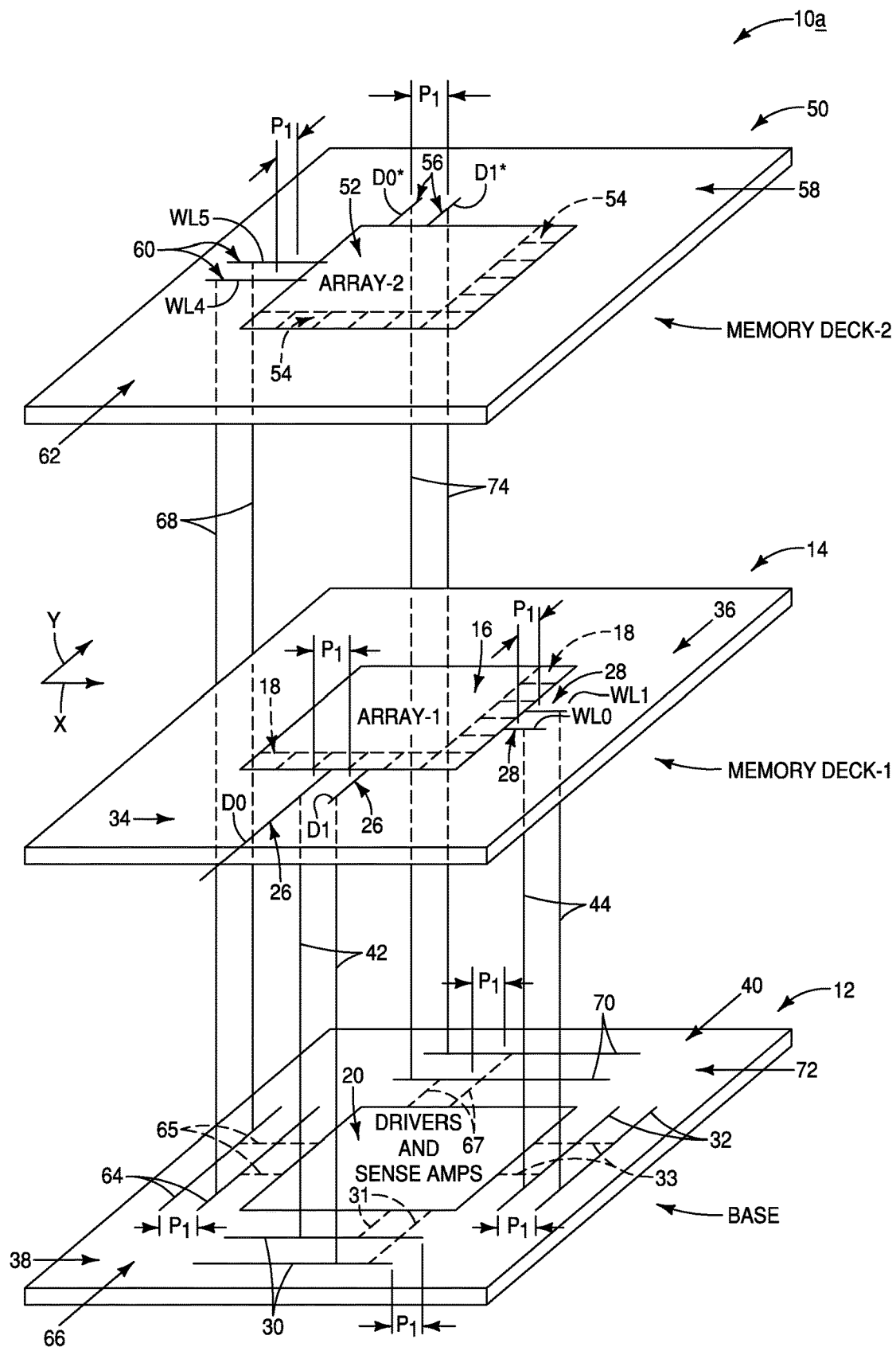

Referring to FIG. 5, an integrated assembly 10a includes the base 12, the deck 14 over the base, and another deck 50 over the deck 14. The decks 14 and 50 may be referred to as Memory Deck-1 and Memory Deck-2, respectively.

The memory array 16 is labeled as Array-1. The second deck 50 includes a second memory array 52 which is labeled as Array-2. The array 52 includes memory cells 54 which are diagrammatically illustrated as boxes within the memory array. Only some of the memory cells are shown, but in practice the memory cells may extend entirely across the memory array. The memory array 52 may comprise any suitable number of memory cells, and in some embodiments may comprise hundreds, thousands, millions, etc., of the memory cells. The memory cells may be DRAM cells, and in some embodiments may be configured in arrangements of the types described above with reference to prior art FIGS. 1-3. In some embodiments, the array 52 may be referred to as a second array of memory cells to distinguish it from the first array of memory cells corresponding to array 16.

The Array-1 of deck 14 and the Array-2 of deck 50 may correspond to the Arrays 1 and 2 described above with reference to FIG. 3. Accordingly, the Array-1 of deck 14 is shown to comprise the digit-lines D0 and D1, and the wordlines WL0 and WL1; while the Array-2 of deck 50 is shown to comprise the digit-lines D0* and D1*, and the wordlines WL4 and WL5. The illustrated digit-lines and wordlines are representative of large numbers of digit-lines and wordlines that may be associated with the respective memory arrays. For instance, each memory array may comprise hundreds, thousands, millions, etc., of digit-lines and wordlines.

The digit-lines of deck 14 are coupled with the digit-line-extensions 26 within the connection-bank 34, and the wordlines of deck 14 are coupled with the wordline-extensions 28 within the connection-bank 36. Analogously, the digit-lines of deck 50 are coupled with digit-line-extensions 56 within a connection-bank 58, and the wordlines of deck 50 are coupled with wordline-extensions 60 within a connection-bank 62. In some embodiments, the digit-lines of the first array 16 (e.g., D0 and D1) may be referred to as first digit-lines, the digit-lines of the second array 52 (e.g., D0* and D1*) may be referred to as second digit-lines, the wordlines of the first array 16 (e.g., WL0 and WL1) may be referred to as first wordlines, and the wordlines of the second array 52 (e.g., WL4 and WL5) may be referred to as second wordlines. In such embodiments, the digit-line-extensions 26 associated with the first array 16 may be referred to as first digit-line-extensions, and the digit-line-extensions 56 associated with the second array 52 may be referred to as second digit-line-extensions. Similarly, the wordline-extensions 28 associated with the first array 16 may be referred to as first wordline-extensions, and the wordline-extensions 60 associated with the second array may be referred to as second wordline-extensions.

In the illustrated embodiment, the digit-line-extensions 26 of deck 14 are orthogonal to the wordline-extensions 28 of deck 14; and the digit-line-extensions 56 of deck 50 are orthogonal to the wordline-extensions 60 of deck 50.

In the illustrated embodiment, the digit-line-extensions 26 are on one side of the memory array 16, and the digit-line-extensions 56 are on an opposing side of the memory array 52 as compared to the relationship of the digit-line-extensions 26 to the memory array 16. Also, the wordline-extensions 28 are on one side of the memory array 16, and the wordline-extensions 60 are on an opposing side of the memory array 52 as compared to the relationship of the wordline-extensions 28 to the memory array 16.

The base 12 comprises the circuitry 20 which includes wordline-driver-circuitry and sense-amplifier-circuitry. The base also includes the conductive lines 30 within the connection-bank 38 and coupled to the digit-line-extensions 26 through the vertical interconnects 42; and includes the conductive lines 32 within the connection-bank 40 and coupled to the wordline-extensions 28 through the vertical interconnects 44. Additionally, the base 12 includes conductive lines 64 within a connection-bank 66; with such conductive lines being coupled to the wordline-extensions 60 through vertical interconnects 68. The conductive lines 64 are coupled with wordline-driver-circuitry of the circuitry 20, with such coupling being diagrammatically illustrated utilizing dashed lines 65. The base 12 also includes conductive lines 70 within a connection-bank 72; with such conductive lines being coupled to the digit-line-extensions 56 through vertical interconnects 74. The conductive lines 70 are coupled with sense-amplifier-circuitry of the circuitry 20, with such coupling being diagrammatically illustrated utilizing dashed lines 67.

In some embodiments, the conductive lines 30 of the base 12 may be referred to as first conductive lines associated with the base, and the conductive lines 70 may be referred to as second conductive lines which are on an opposing side of the circuitry 20 relative to the first conductive lines 30. The first and second conductive lines 30 and 70 both extend along the direction of the x-axis (which may be referred to as a first direction). The assembly 10a may be considered to comprise some digit-lines (e.g., D0 and D1) as third conductive lines along the first deck 14, and associated with the first array 16; and to comprise other digit-lines (e.g., D0* and D1*) as fourth conductive lines along the second deck 50 and associated with the second array 52.

The conductive extensions 26 may be referred to as first conductive extensions along the first deck 14 and extending outwardly from the third conductive lines (e.g., D0 and D1) along the direction of the y-axis (which may be referred to as a second direction), and the conductive extensions 56 may be referred to as second conductive extensions along the second deck 50 and extending outwardly from the fourth conductive lines (e.g., D0* and D1*) along the direction of the y-axis.

The interconnects 42 may be referred to as first vertical interconnects which couple the first conductive lines 30 to the first conductive extensions 26, and the interconnects 74 may be referred to as second vertical interconnects which couple the second conductive lines 70 to the second conductive extensions 56.

Notably, each of the second conductive extensions 26 is coupled to only one of the conductive lines 30, and thus each conductive line 30 is uniquely coupled with one of the digit-lines of the first array 16 (e.g., D0 and D1); and each of the second conductive extensions 56 is coupled to only one of the conductive lines 70, and thus each conductive line 70 is uniquely coupled with one of the digit-lines of the second array 52 (e.g., D0* and D1*).

In some embodiments, the conductive lines 30, 32, 70 and 64 along the base 12 may be referred to as first, second, third and fourth conductive lines, respectively. The first and third conductive lines 30 and 70 extend to sense-amplifier-circuitry within the circuitry 20; and the second and fourth conductive lines 32 and 64 extend to wordline-driver-circuitry within the circuitry 20. In such embodiments, the vertical interconnects 42, 44, 68 and 74 may be referred to as first, second, third and fourth vertical interconnects, respectively. In alternative embodiments, the first, second, third and fourth conductive lines may be considered to correspond to the conductive lines 32, 30, 64 and 70, respectively; so that the second and fourth conductive lines extend to the sense-amplifier-circuitry, and the first and third conductive lines extend to the wordline-driver-circuitry. In such embodiments, the first, second, third and fourth vertical interconnects may be considered to correspond to the interconnects 44, 42, 68 and 74, respectively.

In some embodiments, the conductive lines 32 of the base 12 may be referred to as first conductive lines associated with the base, and the conductive lines 64 may be referred to as second conductive lines which are on an opposing side of the circuitry 20 relative to the first conductive lines 32. The first and second conductive lines 32 and 64 both extend along the direction of the y-axis (which may be referred to as a first direction). The assembly 10a may be considered to comprise some wordlines (e.g., WL0 and WL1) as third conductive lines along the first deck 14, and associated with the first array 16; and to comprise other wordlines (e.g., WL4 and WL5) as fourth conductive lines along the second deck 50 and associated with the second array 52. The conductive extensions 28 may be referred to as first conductive extensions along the first deck 14 and extending outwardly from the third conductive lines (e.g., WL0 and WL1) along the direction of the x-axis (which may be referred to as a second direction), and the conductive extensions 60 may be referred to as second conductive extensions along the second deck 50 and extending outwardly from the fourth conductive lines (e.g., WL4 and WL5) along the direction of the x-axis. The interconnects 44 may be referred to as first vertical interconnects which couple the first conductive lines 32 to the first conductive extensions 28, and the interconnects 68 may be referred to as second vertical interconnects which couple the second conductive lines 64 to the second conductive extensions 60. Notably, each of the second conductive extensions 28 is coupled to only one of the conductive lines 32, and thus each conductive line 32 is uniquely coupled with one of the wordlines of the first array 16 (e.g., WL0 and WL1); and each of the second conductive extensions 60 is coupled to only one of the conductive lines 64, and thus each conductive line 64 is uniquely coupled with one of the wordlines of the second array 52 (e.g., WL4 and WL5).

The conductive lines 30, 32, 26, 28, 56, 60, 64 and 70 may all be on the same pitch; and in the illustrated embodiment are on a pitch $P_1$.

In some embodiments, the circuitry 20 may be considered to comprise a first circuitry which corresponds to either the wordline-driver-circuitry or to the sense-amplifier-circuitry, and to include a second circuitry which corresponds to the other of the wordline-driver-circuitry and the sense-amplifier-circuitry. In such embodiments, the conductive lines of the base 12 which are associated with the first circuitry may be referred to as first and second conductive lines, respectively. For instance, if the first circuitry is the sense-amplifier-circuitry, then the conductive lines 30 and 70 may be considered to be the first and second conductive lines, respectively. The wordlines/digit-lines which are coupled with the first and second conductive lines may be referred to as third and fourth conductive lines, respectively. For instance, the digit-lines D0 and D1 may be referred to as the third conductive lines, and the digit-lines D0* and D1*may be referred to as fourth conductive lines. The conductive extensions coupled with the third and fourth conductive lines may be referred to as first and second conductive extensions, respectively. For instance, the conductive extensions 26 and 56 may referred to as first and second conductive extensions, respectively. The vertical interconnects coupling the first and second conductive extensions to the first and second conductive lines may be referred to as first and second vertical interconnects, respectively. For instance, the conductive extensions 42 and 74 may be referred to as first and second vertical interconnects.

The conductive lines associated with the base 12 and extending to the second circuitry may be referred to as fifth and sixth conductive lines. For instance, the conductive lines 32 and 64 may be referred to as fifth and sixth conductive lines, respectively, in embodiments in which the wordline-driver-circuitry is the second circuitry. In such embodiments, the wordlines/digit-lines which are coupled with the fifth and sixth conductive lines may be referred to as seventh and eighth conductive lines, respectively. For instance, the WL0 and WL1 may be referred to as a seventh conductive lines, and the wordlines WL4 and WL5 may be referred to as eighth conductive lines. The conductive extensions coupled with the seventh and eighth conductive lines may be referred to as third and fourth conductive extensions, respectively. For instance, the conductive extensions 28 and 60 may referred to as third and fourth conductive extensions, respectively. The conductive interconnects coupling the fifth and sixth conductive lines to the third and fourth extensions may be referred to as third and fourth vertical interconnects, respectively. For instance, the interconnects 44 and 68 may be referred to as third and fourth vertical interconnects.

In some embodiments, the conductive lines 30 and 26 may be referred to as first and second conductive lines, respectively; and the conductive lines 70 and 56 may referred to as third and fourth conductive lines, respectively. In such embodiments, the vertical interconnects 42 may be referred to as first interconnects connecting the first and second conductive lines to one another; and the vertical interconnects 74 may be referred to as second interconnects coupling the third and fourth conductive lines to another. The second conductive lines 26 may be considered to be coupled with digit-lines of the first memory array 16, and the fourth conductive lines 56 may be considered to be coupled with digit-lines of the second memory array 52. The circuitry 20 may be considered to comprise sense-amplifier-circuitry which compares signals of the digit-lines from the first memory array 16 with signals from the second memory array 52.

In some embodiments, the conductive lines 32 and 28 may be referred to as first and second conductive lines, respectively; and the conductive lines 64 and 60 may be referred to as third and fourth conductive lines, respectively. The vertical interconnects 44 may be referred to as first interconnects which couple the first conductive lines 32 with the second conductive lines 28, and the vertical interconnects 68 may be referred to as second interconnects which couple the third conductive lines 64 with the fourth conductive lines 60. The second conductive lines 28 may be considered to be coupled with wordlines of the first memory array 16, and the fourth conductive lines 60 may be considered to be coupled with wordlines of the second memory array 52. The circuitry 20 may be considered to comprise wordline-driver-circuitry which drives the wordlines of the first and second memory arrays 16 and 52.

Figure 6:
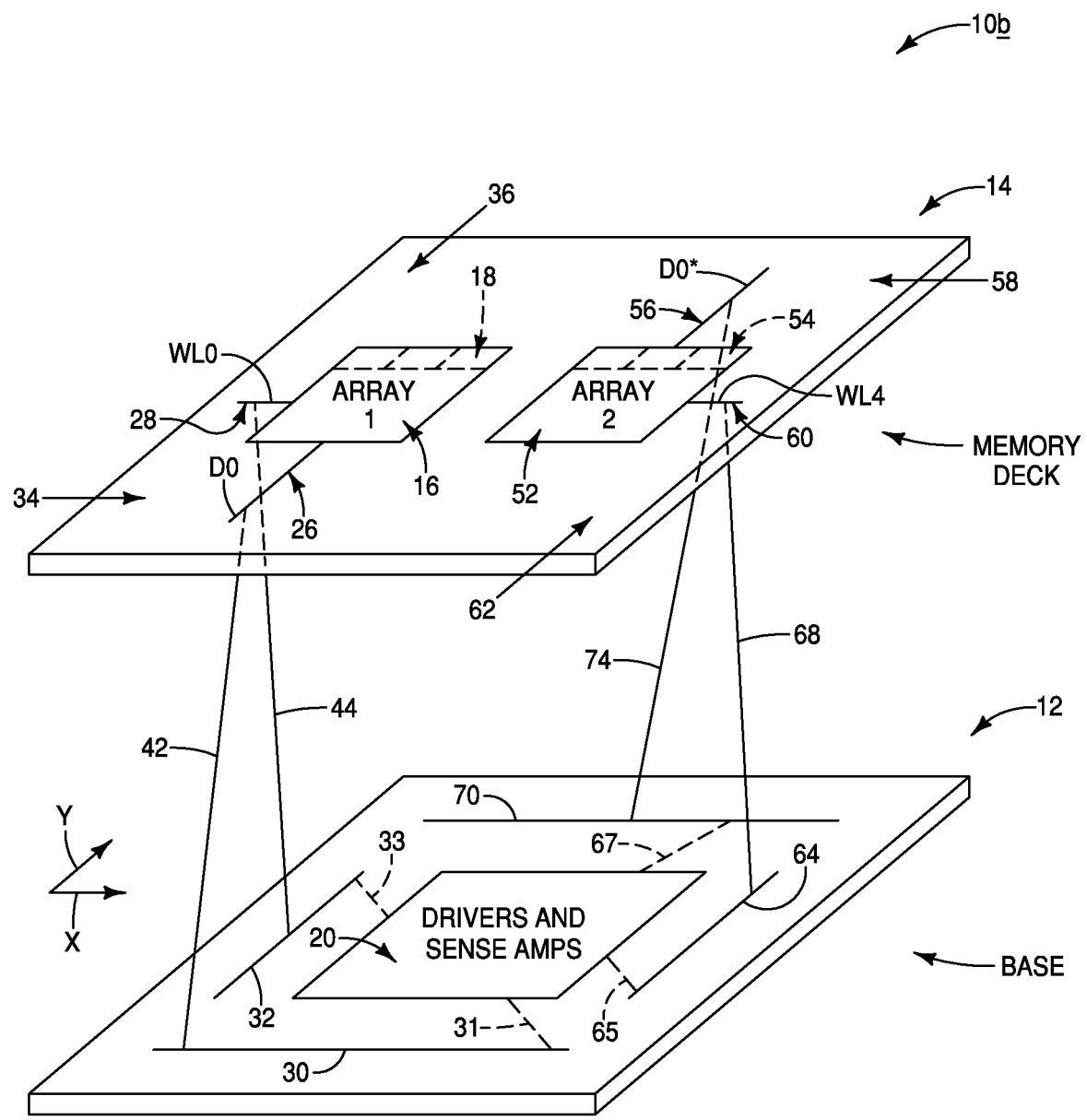

The embodiment of FIG. 5 shows the memory arrays 52 and 16 vertically stacked one atop the other. In other embodiments, the memory arrays may be laterally adjacent one another, as shown in FIG. 6. Specifically, FIG. 6 shows an integrated assembly 10b having the memory deck 14 over the base deck 12. The memory deck 14 comprises the memory arrays 16 and 52 laterally adjacent one another. Example digit-lines D0 and D0*, and digit-line-extensions 26 and 56, are illustrated relative to the memory arrays 16 and 52; with the digit-line-extensions 26 being within a connection-bank 34, and with the digit-line-extension 56 being within a connection-bank 58. Also, example wordlines WL0 and WL4, and the wordline-extensions 28 and 60, are illustrated relative to the memory arrays 16 and 52; with the wordline-extensions 28 being within a connection-bank 36, and with the wordline-extensions 60 being within a connection-bank 62.

The digit-line-extensions 26 and 56 are coupled with conductive lines 30 and 70 associated with the base 12, and such conductive lines may be considered to be connections to the sense amplifiers within the circuitry 20. The wordline-extensions 28 and 60 are coupled with the conductive lines 32 and 64 associated with the base 12, and such conductive lines may be considered to be connections to the wordline drivers within the circuitry 20.

FIGS. 4-6 show embodiments in which the digit-line-extensions (e.g., 26) extend orthogonally relative to the wordline-extensions (e.g., 28). In other embodiments, it may be advantageous for the digit-line-extensions to extend parallel relative to the wordline-extensions and to be on a same pitch as the wordline-extensions, in that such may simplify alignment of the vertically-stacked decks.

Figure 7:
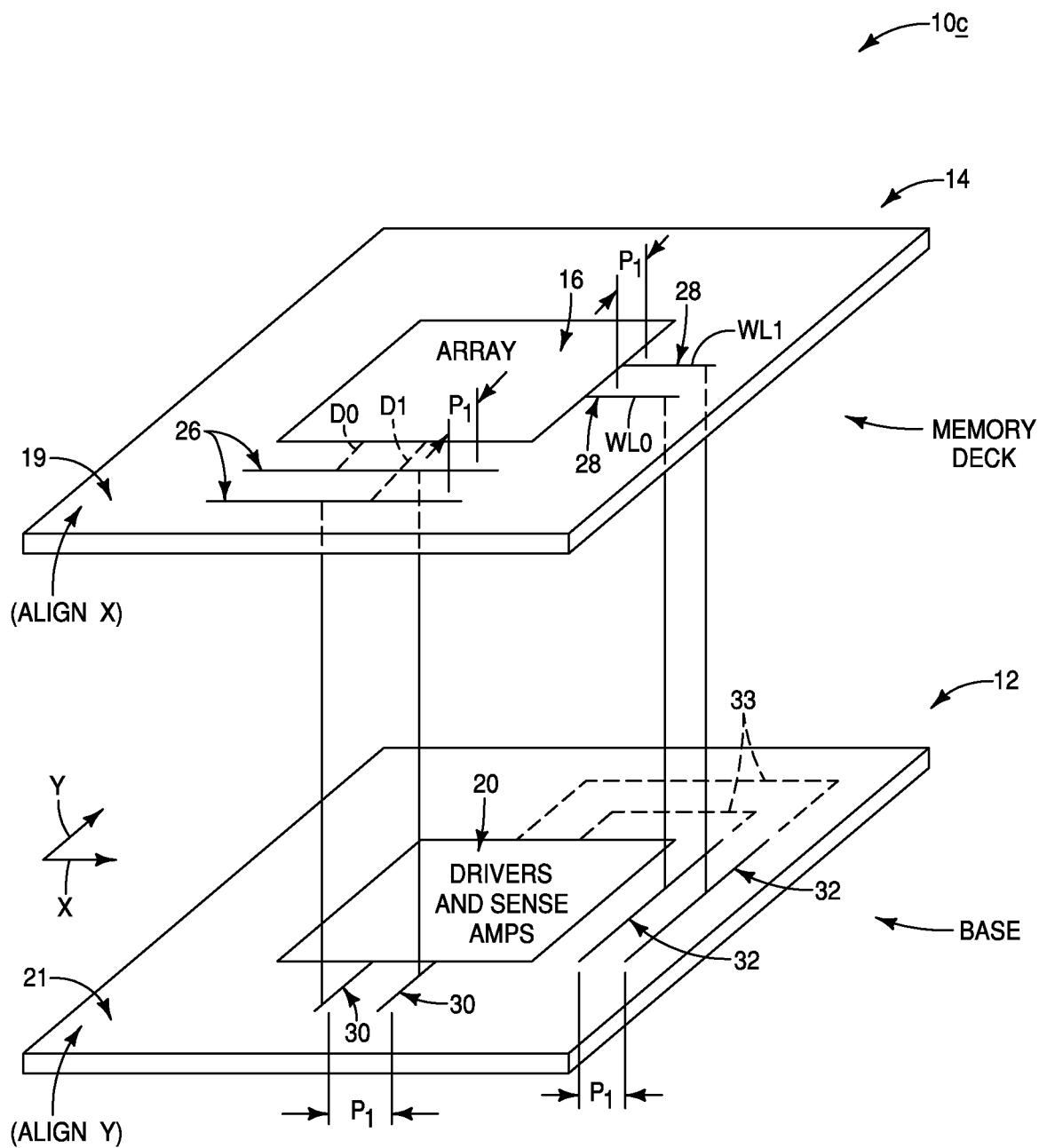

Referring to FIG. 7, an integrated assembly 10c is shown to comprise a first deck 14 over a base 12. The assembly 10c may be considered to be analogous to the region of the assembly 10a of FIG. 5 comprising the deck 14 and the base 12. However, the assembly 10c of FIG. 7 differs from that of FIG. 5 in that the digit-line-extensions 26 are substantially parallel to the wordline-extensions 28 (with the term "substantially parallel" meaning parallel to within reasonable tolerances of fabrication and measurement), rather than being substantially orthogonal to the wordline-extensions. The digit-line-extensions 26 may be routed to the digit-lines (e.g., D0 and D1) with any suitable wiring. The digit-line-extensions 26 may be formed with the same mask utilizing the same processing as that utilized to form the wordlines (e.g., WL0 and WL1) and the wordline-extensions 28. Accordingly, the digit-line-extensions 26 may be formed on a same pitch as the wordline-extensions 28, and may be part of a same pattern as the wordline-extensions. This may enable the same alignment to be utilized for aligning to the digit-line-extensions 26 as is utilized for aligning to the wordline-extensions 28.

The assembly 10c is shown comprising the alignment marks 19 and 21 described above with reference to FIG. 4. However, the alignment marks of the assembly 10c of FIG. 7 are simpler than those of FIG. 4. Specifically, the alignment mark 19 of FIG. 7 has only a single pattern (shown as X) which is utilized to establish alignment of the digit-line-extensions 26 and the wordline-extensions 28 along a first axis, and the alignment mark 21 has only a single pattern (shown as Y) to establish alignment of the digit-line-extensions 26 and the wordline-extensions 28 along a second axis orthogonal to the first axis. Accordingly, the utilization of digit-line-extensions 26 which are parallel to the wordline-extensions 28 may enable simpler alignment of vertically-stacked decks as compared to embodiments in which the digit-line-extensions are orthogonal to the wordline-extensions.

Figure 8:
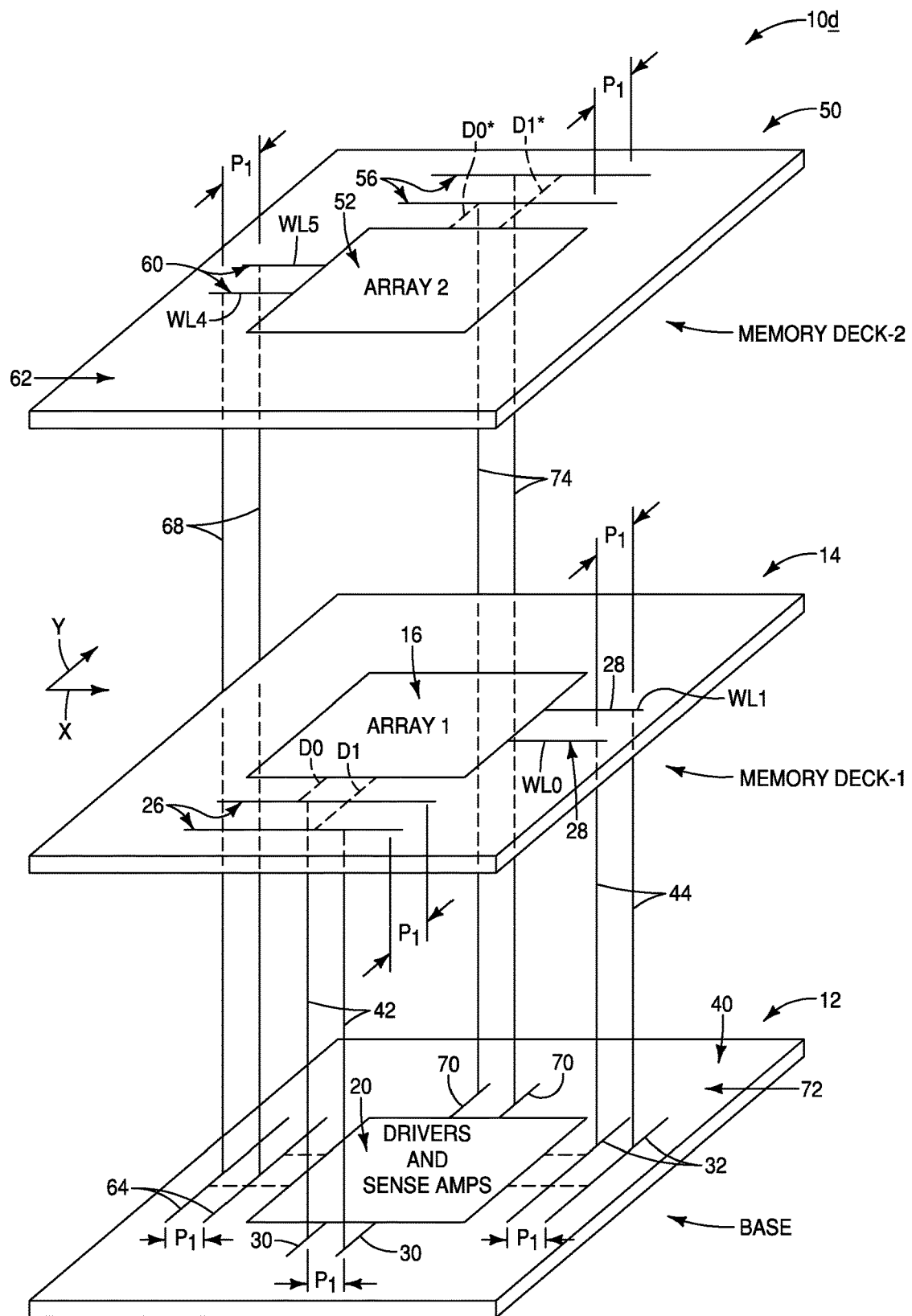

FIG. 8 shows an integrated assembly 10d having memory decks 14 and 50 stacked over the base 12. The assembly 10d of FIG. 8 is analogous to the assembly 10a of FIG. 5, but comprises the digit-line-extensions 26 and 56 extending substantially parallel to the wordline-extensions 28 and 60. Accordingly, the assembly 10d of FIG. 8 may benefit from the simplified alignment described above with reference to FIG. 7. It is noted that another difference between the assembly 10d of FIG. 8 and the assembly 10a of FIG. 5 is that the conductive lines 30, 32, 64 and 70 associated with the base 12 of the assembly 10d of FIG. 8 are all parallel to one another. In contrast, the conductive lines 30 and 70 of the assembly 10a FIG. 5 extend along the x-axis, while the conductive lines 32 and 64 extend along the y-axis (i.e., are substantially orthogonal to the conductive lines 30 and 70).

Figure 9:
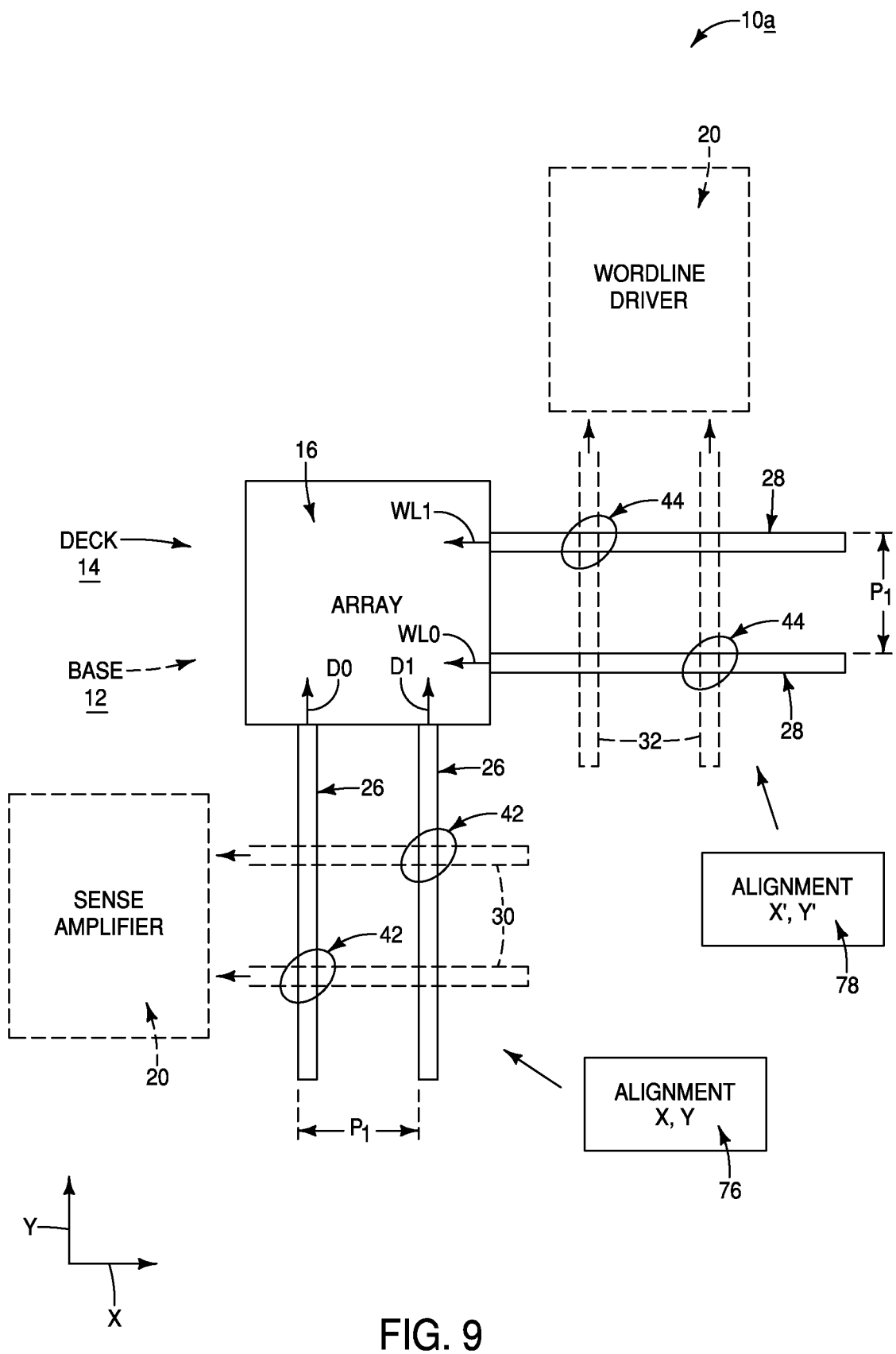
FIG. 9 is a diagrammatic plan view of an example integrated assembly having components from an upper deck (shown in solid line view) overlapping components of a lower deck (shown in dashed-line view).
Figure 10:
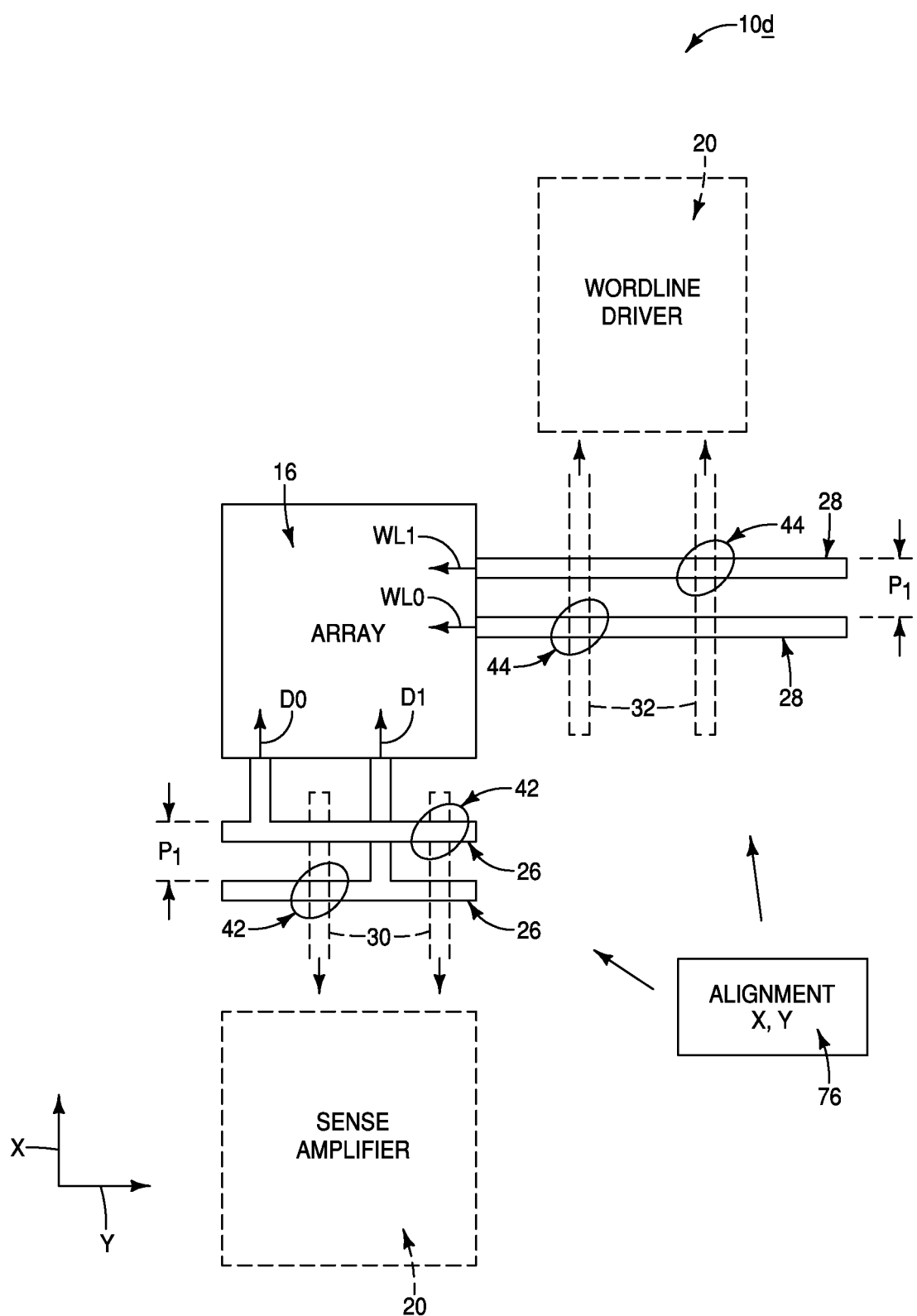
FIG. 10 is a diagrammatic plan view of an example integrated assembly having components from an upper deck (shown in solid line view) overlapping components of a lower deck (shown in dashed-line view).

FIGS. 9 and 10 are provided to further describe the difference between utilization of digit-line-extensions extending substantially orthogonal to the wordline-extensions, and the utilization of digit-line-extensions extending substantially parallel to the wordline-extensions.

Referring to FIG. 9, such diagrammatically shows a region of the configuration 10a of FIG. 5; and specifically shows a portion of the deck 14 (in solid lines) over a portion of the base 12 (in dashed lines). The digit-line-extensions 26 are shown coupled with digit-lines (e.g., D0 and D1) which extend into the memory array 16, and the wordline-extensions 28 are shown coupled with wordlines (WL1 and WL2) which extend into the memory array. The digit-line-extensions 26 are coupled with conductive lines 30 through the vertical interconnects 42, and the wordline-extensions 28 are coupled with conductive lines 32 through the vertical interconnects 44. The conductive lines 30 are along the base 12, and are coupled with sense amplifiers within the circuitry 20; and the conductive lines 32 extend along the base 12 and are coupled with wordline drivers within the circuitry 20.

The digit-line-extensions 26 are substantially orthogonal to the wordline-extensions 28, and are also substantially orthogonal to the underlying conductive lines 30. The wordline-extensions 28 are substantially orthogonal to the underlying conductive lines 32.

The alignment of the deck 14 relative to the base 12 comprises comparison of the decks along the x and y directions (i.e., along the x-axis direction and the y-axis direction of the illustrated axis system).

The digit-line-extensions 26 are aligned with the conductive lines 30 in a manner which compensates for misalignment utilizing X and Y patterns within alignment marks associated with the deck 14 and the base 12. One of the X and Y patterns is on the deck 14, and the other is on the base 12. The alignment utilizing the X and Y patterns is illustrated in FIG. 9 with a box 76.

The wordline-extensions 28 are aligned with the conductive lines 32 utilizing X' and Y' patterns within the alignment marks associated with the deck 14 and the base 12. One of the X' and Y' patterns is on the deck 14, and the other is on the base 12. The alignment utilizing the X' and Y' patterns is illustrated in FIG. 9 with a box 78.

FIG. 10 diagrammatically shows a region of the configuration 10d of FIG. 8; and specifically shows a portion of the deck 14 (in solid lines) over a portion of the base 12 (in dashed lines). The digit-line-extensions 26 are shown coupled with digit-lines (e.g., D0 and D1) which extend into the memory array 16, and the wordline-extensions 28 are shown coupled with wordlines (WL1 and WL2) that extend into the memory array. The digit-line-extensions 26 are coupled with conductive lines 30 through the vertical interconnects 42, and the wordline-extensions 28 are coupled with conductive lines 32 through the vertical interconnects 44. The conductive lines 30 are along the base 12, and are coupled with sense amplifiers within the circuitry 20; and the conductive lines 32 extend along the base 12 and are coupled with wordline drivers within the circuitry 20.

The digit-line-extensions 26 are substantially parallel to the wordline-extensions 28, and are part of the same pattern utilized to form the wordline-extensions. The digit-line-extensions 26 and the wordline-extensions 28 are substantially orthogonal to the underlying conductive lines 30 and 32. The conductive lines 30 and 32 may be part of the same pattern as one another, and are formed along the base 12.

The alignment of the deck 14 relative to the base 12 comprises comparison of the decks along the x and y directions (i.e., along the x-axis direction and the y-axis direction of the illustrated axis system), but only requires the X and Y patterns (shown with the box 76) since only one pattern from deck 14 (the pattern having the wordline-extensions 28 as well as the digit-line-extensions 26) is being aligned with one pattern from base 12 (the pattern having conductive lines 30 and 32). Thus, the alignment of the decks of assembly 10d of FIG. 10 may be simpler than the alignment of the decks of assembly 10a of FIG. 9.

Figure 11:
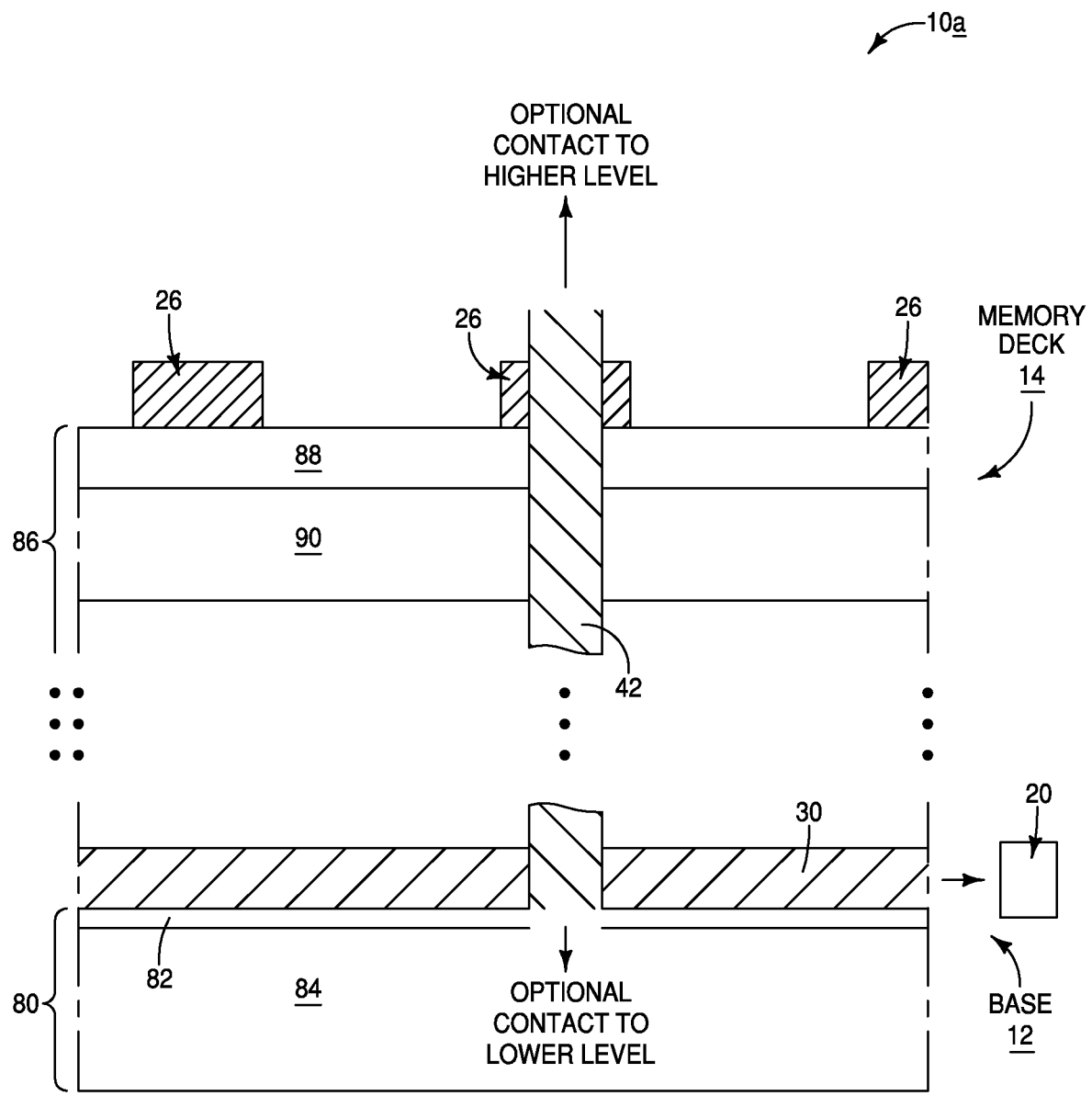
FIG. 11 is a diagrammatic cross-sectional side view of a region an example integrated assembly showing an example connection between an upper deck and a lower deck.

The vertical interconnects 42, 44, 68 and 74 of FIGS. 4-9 may comprise any suitable configurations. FIG. 11 shows an example configuration of a vertical interconnect. Specifically, FIG. 11 illustrates a region of the configuration 10a of FIG. 5; and specifically shows a portion of the deck 14 stacked over a portion of the base 12. A conductive line 30 is shown along the base 12, and is shown to be supported by an underlying substrate 80. The substrate 80 has insulative material 82 directly under the conductive line 30, and has a semiconductor substrate 84 supporting the insulative material 82. The digit-line-extensions 26 are shown along the memory deck 14, and are shown to be supported by an underlying substrate 86. The substrate 86 has insulative material 88 directly under the digit-line-extensions, and has a semiconductor substrate 90 supporting the insulative material 88.

The vertically-extending interconnect 42 comprises conductive material that directly contacts one of the digit-line-extensions 26, and the conductive material 30. In the shown embodiment, the vertically-extending interconnect 42 passes through the conductive line 30 to optionally connect with conductive components at a level below the base 12, and passes through the extension 26 to optionally connect with conductive components at a level above the memory deck 14. In other embodiments, the vertically-extending interconnect 42 may terminate along the conductive line 30 and/or along the extension 26, rather than optionally extending past the conductive line 30 and/or the extension 26.

The conductive materials of extension 26, line 30 and interconnect 42 may comprise any suitable composition(s); such as, for example, one or more of various metals (e.g., titanium, tungsten, cobalt, ruthenium, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). The insulative materials 82 and 88 may comprise any suitable composition(s); including, for example, one or both of silicon dioxide and silicon nitride.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a base supporting first circuitry and first conductive lines. The first conductive lines extend along a first direction and are associated with the first circuitry. A deck is over the base and supports an array of memory cells and second conductive lines which are associated with the array of memory cells. The second conductive lines extend along a second direction which is substantially orthogonal to the first direction. Vertical interconnects extend from the deck to the base and couple the first conductive lines to the second conductive lines. Each of the vertical interconnects couples one of the first conductive lines to one of the second conductive lines. Each of the second conductive lines is coupled with only one of the first conductive lines.

Some embodiments include an integrated assembly which includes a base comprising wordline-driver-circuitry and sense-amplifier-circuitry. First conductive lines are associated with the base and extend to the sense-amplifier-circuitry. Second conductive lines are associated with the base and extend to the wordline-driver-circuitry. A deck is over the base and comprises an array of memory cells. Digit-lines are supported by the deck and are associated with the array of memory cells. Each of the digit-lines has an extension which crosses over the first conductive lines and which is orthogonal to the first conductive lines. Wordlines are supported by the deck and are associated with the array of memory cells. Each of the wordlines has an extension which crosses over the second conductive lines and which is orthogonal to the second conductive lines. First vertical interconnects extend from the deck to the base and couple the first conductive lines to the digit-line-extensions. Each of the first vertical interconnects couples one of the first conductive lines to one of the digit-line-extensions. Each of the first conductive lines is coupled with only one of the digit-line-extensions. Second vertical interconnects extend from the deck to the base and couple the second conductive lines to the wordline-extensions. Each of the second vertical interconnects couples one of the second conductive lines to one of the wordline-extensions. Each of the second conductive lines is coupled with only one of the wordline-extensions.

Some embodiments include an integrated assembly having a base comprising first circuitry. First and second conductive lines are associated with the base and extend to the first circuitry. The second conductive lines are on an opposing side of the first circuitry relative to the first conductive lines. The first and second conductive lines extend along a first direction. A first deck is over the base and comprises a first array of first memory cells. A second deck over the first deck and comprises a second array of second memory cells. Third conductive lines are along the first deck and associated with the first array. Fourth conductive lines are along the second deck and are associated with the second array. First conductive extensions are along the first deck and extend outwardly from the third conductive lines along a second direction which crosses the first direction. Second conductive extensions are along the second deck and extend outwardly from the fourth conductive lines along the second direction. First vertical interconnects extend from the first deck to the base and couple the first conductive lines to the first conductive extensions. Each of the first vertical interconnects couples one of the first conductive lines to one of the first conductive extensions. Each of the first conductive lines is coupled with only one of the first conductive extensions. Second vertical interconnects extend from the second deck to the base and couple the second conductive lines to the second conductive extensions. Each of the second vertical interconnects couples one of the second conductive lines to one of the second conductive extensions. Each of the second conductive lines is coupled with only one of the second conductive extensions.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. An integrated assembly, comprising:
a base comprising first circuitry;
first conductive lines supported by the base and associated with the first circuitry, the first conductive lines extending along a first direction;
a deck over the base and comprising an array of memory cells;
second conductive lines supported by the deck and associated with the array of memory cells, the second conductive lines extending along a second direction substantially orthogonal to the first direction; and
vertical interconnects extending from the deck to the base and coupling the first conductive lines to the second conductive lines; each of the vertical interconnects coupling one of the first conductive lines to one of the second conductive lines; each of the second conductive lines being coupled with only one of the first conductive lines;
wherein the first and second conductive lines are on a same pitch as one another.

2. The integrated assembly of claim 1 wherein the first circuitry is sense-amplifier-circuitry, and wherein the second conductive lines are extensions of digit-lines.

3. The integrated assembly of claim 1 wherein the first circuitry is wordline-driver-circuitry, and wherein the second conductive lines are extensions of wordlines.

4. The integrated assembly of claim 1 wherein the array of memory cells is a first array of memory cells, and wherein the vertical interconnects are first vertical interconnects; and further comprising:
third conductive lines supported by the base and associated with the first circuitry;

a second array of memory cells having fourth conductive lines associated therewith; and second vertical interconnects coupling the fourth conductive lines to the third conductive lines; each of the second vertical interconnects coupling one of the fourth conductive lines to one of the third conductive lines; each of the fourth conductive lines being coupled with only one of the third conductive lines.

5. The integrated assembly of claim 4 wherein the second array of memory cells is supported by the deck and is laterally adjacent to the first array of memory cells.

6. The integrated assembly of claim 5 wherein:
the first circuitry is sense-amplifier-circuitry;
the second conductive lines are extensions of digit-lines; and
the fourth conductive lines are extensions of digit-lines.

7. The integrated assembly of claim 5 wherein:
the first circuitry is wordline-driver-circuitry;
the second conductive lines are extensions of wordlines; and
the fourth conductive lines are extensions of wordlines.

8. The integrated assembly of claim 4 wherein the deck is a first deck; and wherein the second array of memory cells is supported by a second deck which is over the first deck.

9. The integrated assembly of claim 8 wherein:
the first circuitry is sense-amplifier-circuitry;
the second conductive lines are extensions of digit-lines; and
the fourth conductive lines are extensions of digit-lines.

10. The integrated assembly of claim 8 wherein:
the first circuitry is wordline-driver-circuitry;
the second conductive lines are extensions of wordlines; and
the fourth conductive lines are extensions of wordlines.

* * * * *